(12) United States Patent
Naito et al.

(10) Patent No.: US 7,990,480 B2
(45) Date of Patent: Aug. 2, 2011

(54) BROADCAST RECEIVING APPARATUS, AND A TUNER AND A DISTRIBUTOR FOR THE SAME

(75) Inventors: Yasushi Naito, Yokohama (JP); Katsunobu Kimura, Yokohama (JP); Katsunori Mochizuki, Queens (SG)

(73) Assignee: Hitachi, Ltd., Tokyo (JP)

( * ) Notice: Subject to any disclaimer, the term of this patent is extended or adjusted under 35 U.S.C. 154(b) by 1283 days.

(21) Appl. No.: 11/604,311

(22) Filed: Nov. 27, 2006

(65) Prior Publication Data

US 2007/0242165 A1  Oct. 18, 2007

(30) Foreign Application Priority Data

Apr. 18, 2006  (JP) .................................. 2006-114068

(51) Int. Cl.
 *H04N 5/50* (2006.01)
 *H04N 5/44* (2006.01)
(52) U.S. Cl. ........................................ 348/731; 348/725
(58) Field of Classification Search .......... 348/725–728, 348/731, 818–820, 554; 455/300, 301; *H04N 5/44, H04N 5/50*
See application file for complete search history.

(56) References Cited

U.S. PATENT DOCUMENTS

| 5,950,112 | A  | * | 9/1999 | Hori et al. | .................... | 348/725 |
| 6,765,626 | B1 | * | 7/2004 | Tanaka | ......................... | 348/731 |
| 2005/0122428 | A1 | | 6/2005 | Kawakami et al. | | |

FOREIGN PATENT DOCUMENTS

| DE | 196 49 433 | 6/1997 |
| EP | 1 202 564 | 5/2002 |
| EP | 1 211 919 | 6/2002 |
| EP | 1 494 362 | 1/2005 |
| JP | 8-228129 | 9/1996 |
| JP | 8-237154 | 9/1996 |
| JP | 11-231974 | 8/1999 |
| JP | 11-261911 | 9/1999 |
| JP | 11-317687 | 11/1999 |
| JP | 2001-044870 | 2/2001 |
| JP | 2003-304162 | 10/2003 |

* cited by examiner

*Primary Examiner* — Sherrie Hsia
(74) *Attorney, Agent, or Firm* — Antonelli, Terry, Stout & Kraus, LLP.

(57) ABSTRACT

Within a broadcast receiving apparatus, mounting therein two (2) pieces of tuner units, each being receivable at least three (3) kinds of broadcasting signals, and being receivable plural numbers of broadcasting signals, simultaneously, the tuner units, each capable to receive an analog terrestrial broadcasting signal, digital BS/CS broadcasting signals, and a digital terrestrial broadcasting signal, are mounted within a housing 11 of the broadcast receiving apparatus 10, wherein a main tuner 110 and a sub-tuner 120 are mounted on both surfaces of a substrate 100, directing upper and lower surfaces thereof into the same direction, and distributors 130 and 140 for distributing antenna inputs are attached between input terminals 111, 112, 121 and 122 of those tuner units, bridging over both surfaces of the substrate, and thereby providing a technology for mounting or packaging the tuner units, with achieving small-sizing and thin-sizing thereof.

27 Claims, 4 Drawing Sheets

BROADCAST RECEIVING APPARATUS, AND A TUNER AND A DISTRIBUTOR FOR THE SAME

BACKGROUND OF THE INVENTION

The present invention relates to a broadcast receiving apparatus for receiving a broadcast signal and displaying a picture, such as, a television receiver, for example, and in particular, it relates to a broadcast receiving apparatus enabling to receive plural kinds of television signals broadcasted (for example, digital/analog terrestrial broadcastings, and digital/analog BC/CS broadcasting), in plural numbers thereof, simultaneously, as well as, the structures of a tuner and further a distributor for that.

The terrestrial digital broadcasting is started in 2003, and accompanying with this, it is necessary for a broadcast receiving apparatus (i.e., a television receiving apparatus) to receive three (3) kinds of broadcast signals, including the conventional analog broadcasting and the BS/CS therein. Also, at the same time, in recent years, a flat-type display panel comes to a main stream, as a display device in the broadcast receiving apparatus, in the place of the conventional cathode ray tube (CRT). However, as such the flat-type display panel is widely used one, mainly, applying a liquid crystal panel or a plasma display panel (hereinafter, being abbreviated by "PDP"), and it is called by a thin-type or flat-type television.

Then, in the broadcast receiving apparatus, accompanying with an increase of the number of kinds of the receivable signals broadcasted, it is necessary to deal with those three (3) kinds broadcast signals, i.e., mounting or packaging at least three (3) kinds of tuners therein. At that instance, in particular, in case of the thin or flat-type television, an internal space thereof is small, comparing to that within the structures of the conventional CRT-type television, and for that reason, it is difficult to install those necessary three (3) pieces of the tuners within an inside of the apparatus, in the form of an internal circuit. Further, multi-functioning is remarkable, in recent years, for the television receiving apparatus, and in particular, for achieving so-called, a TV built-in recording function or a two-screen function, including a simultaneous recording function of viewing one program broadcasted while recording other program broadcasted at the same time, at least two (2) pieces of the tuners are necessary for each of the kinds of the broadcasts, respectively. Thus, with this, at least six (6) pieces of tuners, in total, must be installed within an inside of broadcast receiving apparatus.

However, conventionally, for dissolving such the problem, for example, three (3) kinds of the tuners for receiving the broadcasts, each being formed separately, i.e., a tuner for use of terrestrial digital broadcastings, a tuner for use of terrestrial analog broadcastings, and a tuner for use of BS/CS, are combined with as one (1) piece of unit, and further two (2) pieces of the units are installed within the inside of the apparatus, for dealing with the TV built-in recording function and/or the two-screen function.

In the broadcast receiving apparatus, according to such the conventional art, various kinds of broadcasted signals received with an antenna are supplied to the two (2) pieces of the tuner units mentioned above, via an antenna splitter, however, in that instance, it is necessary to connect between the splitter and the tuners by means of a cable. And, the cable is wound around from the antenna, which is set up, reaching to the position where the broadcast receiving apparatus is set up, but in that instance, accompanying with the winding-around of that cable, disturbance is made upon a very weak signal flowing inside, and further there brings about a problem of attenuation of the signal level thereof. Also, in particular, for the broadcast receiving apparatus, installing two (2) pieces of the tuners mentioned above for enabling the TV built-in recording function and/or the two-screen function, it is disadvantageous in small-sizing and thin-sizing thereof.

On the other hand, conventionally, in the following Patent Document 1, for example, there is disclosed a digital broadcast receiving apparatus, comprising a first tuner being built within a metal shield body, a second tuner also being built within that metal shield body, and a balloon built-in distributor for distributing an antenna input at each of high-frequency input terminals of the first and second turners, thereby directly connecting that distributor with each of the high-frequency input terminals of the first and second turners, respectively.

Also, in the following Patent Document 2 is already known an electronic tuner comprising a first electronic tuner and a second electronic tuner, being built within a common shield housing, and a distributor having two (2) distributing outputs for distributing an antenna input to those electronic tuners respectively.

Further, in the following Patent Document 3 is already known a receiving apparatus having at least two (2) tuners, which are built within a common shield housing, each the tuner comprising an antenna input terminal, respectively, wherein a both-sided substrate of mounting parts, for building up-each tuner, installs the said parts on one side surface thereof while utilizing almost the entire area of the other surface thereof to be a ground surface, and two (2) pieces of the tuners are disposed to be in parallel with each other, facing the ground surfaces thereof, i.e., being in plane-symmetric manner, thereby reducing mutual interfering disturbances in case of applying the structures of parallel disposition.

[Patent Document 1] Japanese Patent Laying-Open No. 2001-44870 (2001);
[Patent Document 2] Japanese Patent Laying-Open No. Hei 11-317687 (1999); and
[Patent Document 3] Japanese Patent Laying-Open No. 2003-304162 (2003).

SUMMARY OF THE INVENTION

Thus, with such the conventional arts as mentioned above, in particular, from those Patent Documents 1 and 2 mentioned above, it is already known that the distributor is attached with the antenna input terminals of two (2) pieces of the tuners, and further in the Patent Document 3 is already known the structures of disposing the two (2) pieces of both-sided substrates, each mounting the parts for the each tuner thereon, facing each other on the other surfaces thereof, i.e., applying almost the entire surfaces thereof to be the ground surfaces, thereby reducing mutual interfering disturbances, for installing two (2) pieces of the tuners. However, sufficient consideration is not given yet on the mounting or packaging structures, being suitable for achieving the small-sizing and the thin-sizing thereof, as well as, resolving the above-mentioned problems accompanying with winding-around of the cables, including therein the structures of disposing the distributor, to which the antenna input terminals are connected, in particular, in case when mounting or packaging a tuner unit capable to receive plural numbers of broadcasting methods on the substrate.

Then, the present invention, accomplished by taking the drawbacks relating to such the conventional arts as was mentioned above into the consideration thereof, provides a technology for enabling to mount or package the tuner units in plural numbers thereof, each being capable to receive broadcasted signals of plural kinds (i.e., three (3) kinds) corresponding to plural numbers of broadcasting methods, with small-sizing and thin-sizing thereof, in particular, within the thin or flat-type broadcast receiving apparatus. Also, with small-sizing of the structures of the distributor, to which the antenna input terminal is connected, the present invention provides a tuner device, hardly generating attenuation of level of a very weak signal due to the winding-around of cable and a distributor for the same, and further a broadcast receiving apparatus using the same therein.

According to the present invention, firstly there is provided a tuner device, being capable to receive broadcast signals differing in broadcasting method thereof, comprising: plural numbers of tuner units, each being able to receive the broadcast signals differing in kind of broadcasting, and having plural numbers of input terminals; a substrate for mounting said plural numbers of tuner units on both surfaces thereof, disposing upper and lower surfaces of said tuner units into same direction; and distributors configured to distribute an antenna signal, each being attached between the input terminals of said plural numbers of tuner units, bridging over the both surfaces of said substrate.

And, according to the present invention, in the tuner device as described in the above, preferably, said distributor comprises the antenna input terminals, being provided in direction perpendicular to the surface of said substrate, or preferably, said substrate comprises a grounding layer in a part thereof, being formed so as to cover one of said tuner units. Further, within the tuner device as described in the above, it is preferable that an electromagnetic shield is further provided on said one of the tuner units.

Also, according to the present invention, there is provided a distributor for the tuner apparatus, as described in the above, comprising: an antenna input terminal; a built-in amplifier for amplifying an input signal inputted therein from said antenna input terminal to a predetermined level; and a pair of output terminals for outputting an output from said amplifier, separately. Further, according to the present invention, within the distributor, as described in the above, it is preferable that said antenna input terminal is disposed in direction perpendicular to said pair of output terminals.

In addition thereto, according to the present invention, there is further provided a broadcast receiving apparatus, being capable to receive broadcast signals differing in broadcasting method thereof, as well as, plural numbers of the broadcast signals, simultaneously, comprising: a housing; a receiver portion, which is configured to receive the broadcast signals from different antennas; a signal processing portion, which is configured to produce audio/video signals upon basis of the signal received by said receiving portion; and a display portion, which is configured to display the audio/video signals from said signal processing portion, wherein said receiver portion comprises plural numbers of tuner units, each being capable to receive the broadcast signals differing in broadcasting method thereof and having plural numbers of input terminals, said plural numbers of tuner units are mounted on both surfaces of a substrate, disposing upper and lower surfaces of said tuner units into same direction, and distributors, which are configured to distribute an antenna signal, are attached between the input terminals of said plural numbers of the tuner units, each bridging over the both surfaces of said substrate.

Further, according to the present invention, the broadcast receiving apparatus, as described in the above, preferably, said broadcast signals differing in broadcasting method thereof include an analog terrestrial broadcasting signal, digital BS/CS broadcasting signals, and a digital terrestrial broadcasting signal, or preferably, said broadcast receiving apparatus having the TV built-in recording function or the two (2)-screens function, and further, preferably it is constructed with the thin or flat-type display.

As was mentioned above, with the tuner device, the distributor for the same, and the broadcast receiving apparatus, according to the present invention, it is possible to mount the tuner devices in plural number thereof, each being receivable plural kinds of broadcasting signals corresponding to plural numbers of broadcasting methods, in particular, within the housing of the thin or flat-type broadcast receiving apparatus, thereby achieving small-sizing and thin-sizing thereof. Also, since it is possible to small-size the structures of the distributors, to which the antenna inputs are connected, there can be obtain also a practically superior effect of providing superior structures for mounting or packaging, without causing attenuation of level of the very weak signal due to the winding-around of the cable, etc.

BRIEF DESCRIPTION OF THE DRAWINGS

Those and other objects, features and advantages of the present invention will become more apparent from the following detailed description when taken in conjunction with the accompanying drawings wherein.

DETAILED DESCRIPTION OF PREFERRED EMBODIMENTS

Hereinafter, embodiments according to the present invention will be fully explained by referring to the attached drawings.

Figure 1A:
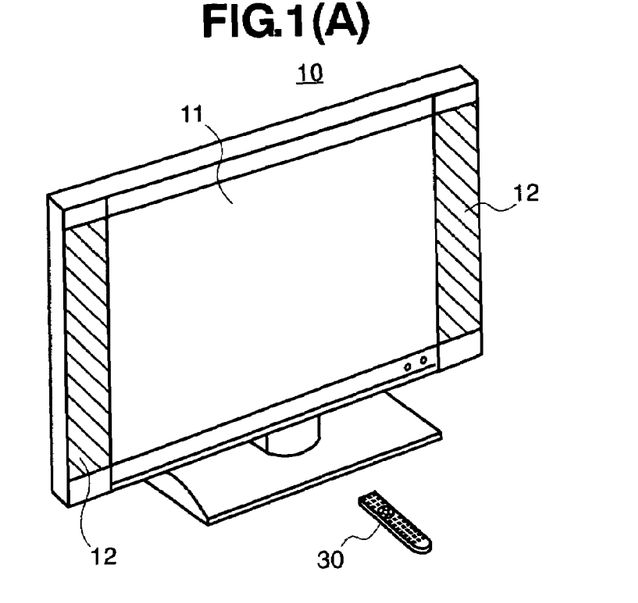
FIGS. 1(A) and 1(B) are perspective views for showing the entire structures of a broadcast receiving apparatus, according to an embodiment of the present invention, each being seen from the front or the rear thereof, respectively.
Figure 1B:
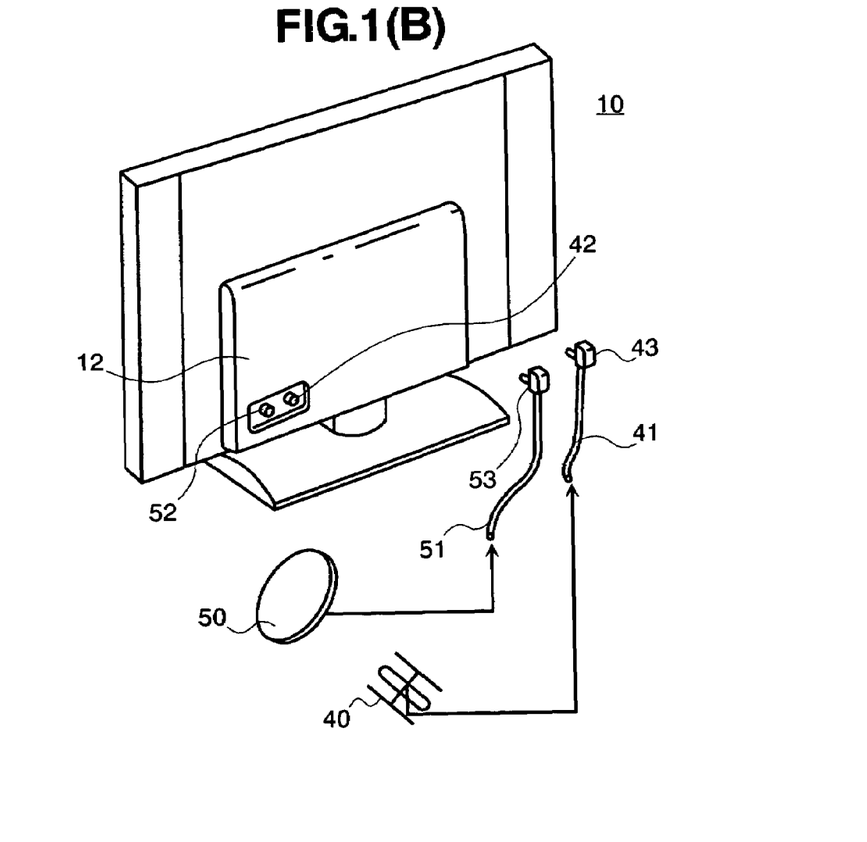

First of all, FIG. 1(A) attached herewith is a perspective view for showing an outer configuration of a broadcast receiving apparatus, in particular, in front thereof, according to an embodiment of the present invention, and FIG. 1(B) a perspective view for showing the outer configuration of the same, in rear thereof. In those figures, a broadcast receiving apparatus 10 includes therein a tuner for receiving a television broadcast signal, in a part thereof, and is able to receive any one of a standard NTSC signal of analog terrestrial broadcasting, a signal of digital BS/CS broadcastings, and a signal of digital terrestrial broadcasting, or an arbitrary combination of them, or all the broadcast signals. Also, this broadcast receiving apparatus 10 may includes a hard disk drive (i.e., a HDb) for recording those broadcast signals therein or a digital versatile player/recorder (i.e., so-called a DVD player/recorder) within an inside thereof, or in an outside thereof. Other than that, it may have an input for a video signal and/or a component signal, and an output thereof.

Also, a display panel (i.e., a display portion) 11 shown in FIG. 1(A) may be built up with a thin or flat-type display, such as, a liquid crystal panel, a PDP or a FED, etc. However, explanation will be made in below, assuming that either the liquid crystal display or the PDP is applied to be the display panel 11. And, reference numerals 20 in the figure indicates speakers for outputting sounds/voices, which are provided on both sides of the display panel (display portion) 11. In addition thereto, a reference numeral 30 in the figure indicates, so-called, a remote controller to be used for controlling the operations of the broadcast receiving apparatus 10 mentioned above.

And, as is shown in FIG. 1(B), on the opposite side (or the reverse side) of the display panel (display portion) 11, for example, a substrate (i.e., a tuner portion) is installed within an side of a housing 12, including a tuner unit capable to receive the three (3) kinds of broadcast signals, including the conventional analog broadcasting and the BS/CS broadcastings therein. In the broadcast receiving apparatus 10, according to the present embodiment, although the details thereof will be explained later, however, two (2) pieces of tuners are provided for the three (3) kinds of broadcastings mentioned above, respectively, for achieving the so-called TV built-in recording function, including a simultaneous recording function viewing one program broadcasted while recording the other program, at the same time, and/or two (2)-screen function, for dealing with the trend of multi-functioning in recent years. Thus, the broadcast receiving apparatus installs six (6) pieces of the tuners in total, within the inside thereof. Further, in this FIG. 1(B), a reference numeral 42 indicates an antenna input terminal for guiding a received signal supplied from an antenna 40 for receiving the terrestrial broadcast signal through a cable 41 to the tuner portion within the apparatus, on the other hand a reference numeral 52 indicates an antenna input terminal for guiding a received signal supplied from a parabola-like antenna 50 for receiving the BS/CS broadcast signals through a cable 51 to the tuner within the apparatus, wherein terminals of those cables (i.e., cable terminals) are indicated by reference numerals 43 and 53, respectively.

Figure 2A:
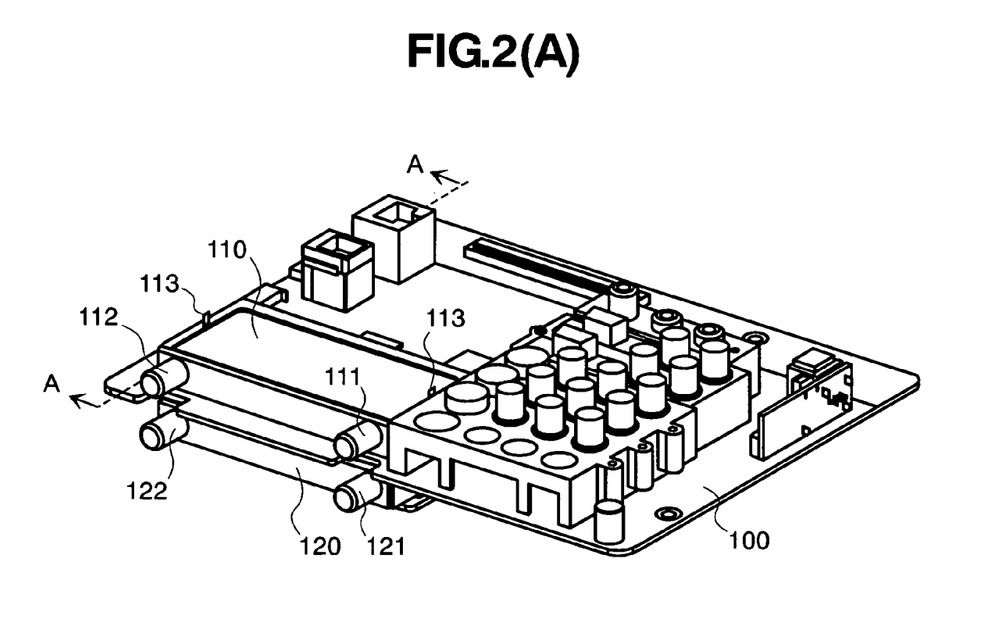
FIGS. 2(A) and 2(B) are perspective views for showing the mounting or packaging structure of a tuner portion built within the broadcast receiving apparatus mentioned above, and for showing conditions before and after it is attached.
Figure 2B:
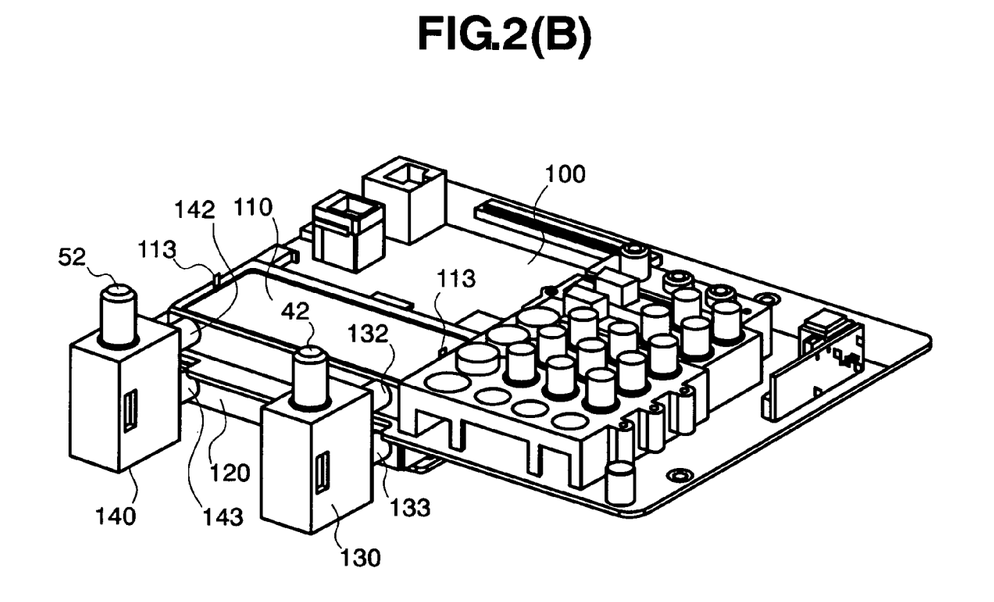

Next, FIGS. 2(A) and 2(B) show the inside of the broadcast receiving apparatus 10 mentioned above, i.e., the entire structures of the tuner portion, which is installed within an side of the housing 12, which is provided on the reverse side of the display panel (display portion) 11. However, FIG. 2(A) shows the entire structures of the tuner portion before being attached with distributors (i.e., antenna splitters), including the antenna input terminals 42 and 52 therein, and FIG. 2(B) shows that but after being attached with the said distributors 130 and 140. As is apparent from those figures, in this tuner portion, various kinds of circuit parts including a main tuner 110 and/or input terminals are mounted on one-side surface of one (1) piece of substrate 100, and on the other-side thereof is mounted a sub-tuner 120. However, as the main tuner 110 and the sub-tuner 120 are used those same to each other in the configuration (or, the same tuner is used commonly), each being constructed with a tuner unit capable to receive the three (3) kinds of broadcast signals, including the conventional analog broadcasting and/or the BS/CS broadcastings (i.e., a three-in-one tuner). In other words, the three-in-one tuners are disposed (i.e., in the two-stages) on both sides of a substrate 100, and two distributors (i.e., the antenna splitters) 130 and 140 are connected to the two (2) input terminals (or, connect plugs) of each of the three-in-one tuners, which are disposed into the two-stages, respectively, i.e., the input terminals 111 and 112 of the main tuner 110 and the input terminals 121 and 122 of the sub-tuner 120 are directly connected, in the structures thereof.

Also, as is apparent in FIG. 2(B), on each of the distributors 130 and 140 are provided the above-mentioned antenna input terminals 42 and 52 (see FIG. 1(B) mentioned above), for connecting the cables 41 and 51 therewith, i.e., for inserting the cable terminals 43 and 53 therein. Namely, the terrestrial broadcast signal is supplied through the distributor 140 to the input terminals 112 of the main tuner 110 and the sub tuner 120, while the BS/CS signals are supplied through the distributors 130 to the input terminals 111 of the main tuner 110 and the sub tuner 120. Also, as will be explained later, on each of the distributors 130 and 140 are provided a pair of output terminals (connect plugs) 132 and 133, and 142 and 143, respectively. Further, those antenna input terminals 42 and 52 are provided perpendicular to the tuner units mentioned above, in more details, in the direction perpendicular to the surface of the substrate 100 mentioned above, while on the other hand, the pair of output terminals 132 and 133 or 142 and 143 are provide in the direction parallel with the surface of the substrate 100, i.e., in the direction perpendicular to the cable terminals 43 and 53 mentioned above.

Figure 3A:
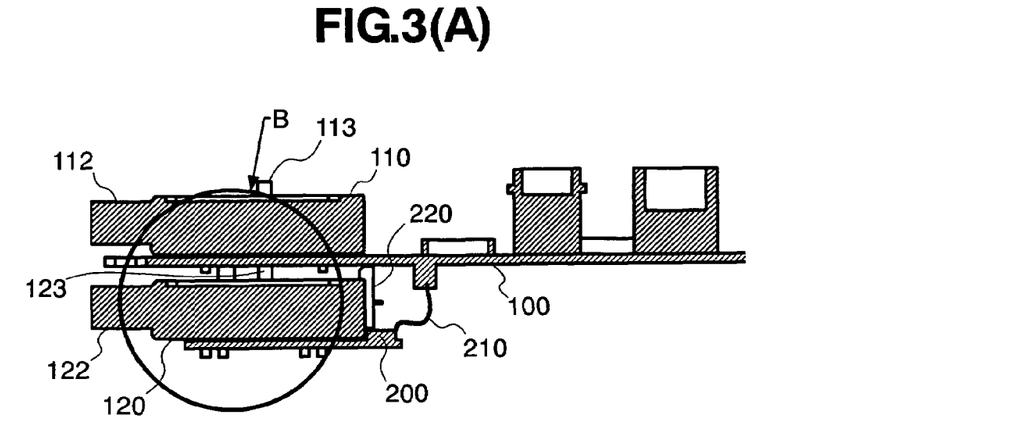
FIGS. 3(A) and 3(B) are A-A cross-section view in FIG. 2(A) and an enlarged partial cross-section view thereof.
Figure 3B:
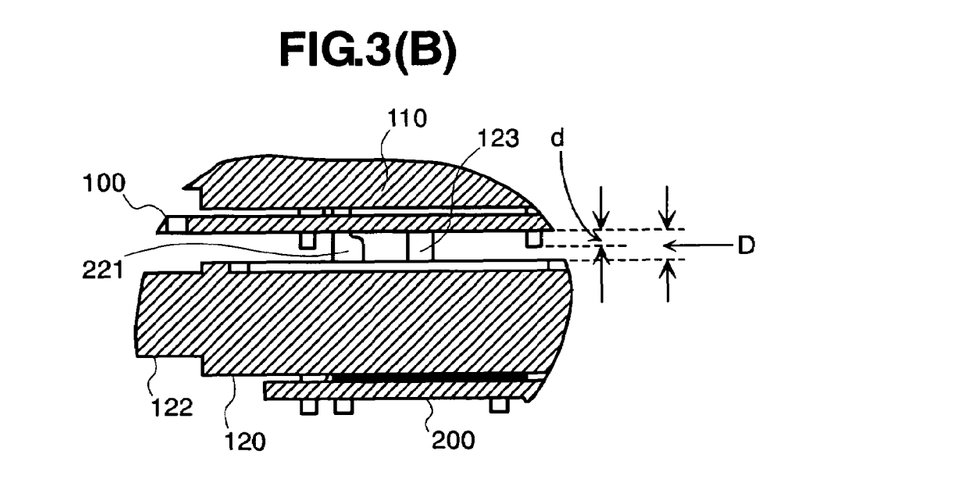

Further, FIG. 3(A) attached here with shows the cross-section view (i.e., the A-A cross-section in FIG. 2(A) mentioned above) for showing the details of the structures for mounting or packaging the main tuner 110 and the sub-tuner 120 on both side surfaces of the substrate 100, and FIG. 3(B) shows an enlarged cross-section view of a part thereof (i.e., "B" portion in FIG. 3(A)). As is apparent from those figures, the main tuner 110 and the sub-tuner 120, being same in the configuration or used commonly, are disposed, each directing the upper and the lower surface thereof into the same direction. For that reason, it is possible to locate the positions of the input terminals 112 for the terrestrial broadcast signal of each tuner unit to be equal when seeing the tuner units from above. In the similar manner, it is also possible to locate the positions of the input terminals for the BS/CS broadcast signals to be equal to each other. Accordingly, with such dispositions, it is possible to connect two (2) pieces of input terminals 111 with themselves and two (2) pieces of input terminals 112 with themselves, by means of the distributors 130 and 140, each being such simple structures as shown in FIG. 3(B). However, in those figures, a pair of holding mechanisms 113 or 123 of the tuner unit, which will be explained in more details later, are attached around the central portion between both sides of the main tuner 110 or the sub-tuner 120, respectively.

Figure 4:
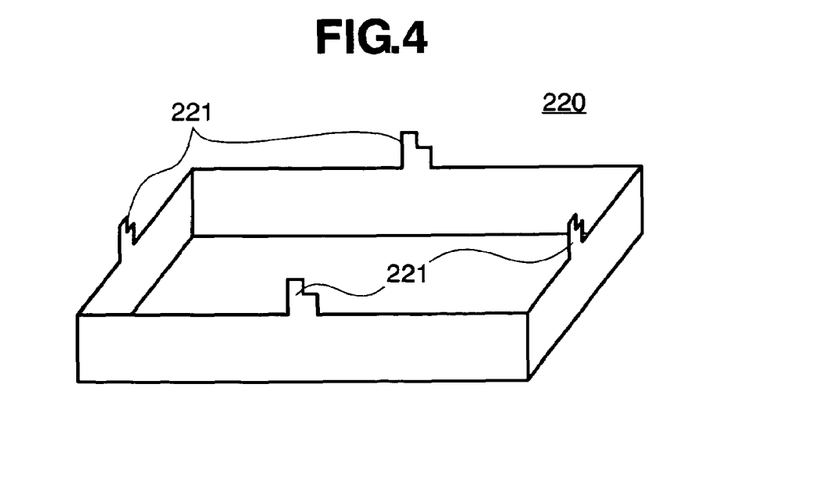
FIG. 4 is a perspective view for showing an example of the structure of an electromagnetic shield case within the mounting or packaging structure of the tuner portion mentioned above.

Further, as is apparent in FIG. 3(A), the sub-tuner 120, which is disposed below the substrate 100, is mounted on a sub-tuner holding substrate 200, and this sub-tuner holding substrate 200 is electrically connected between wiring formed on the substrate 100 through a flat cable 210, for example. Herein, the substrate 100 and the sub-tuner holding substrate 200 are in parallel with each other, and are so disposed that the soldering surfaces thereof do not face to each other. Moreover, as was mentioned above, further on an outer periphery of this sub-tuner holding substrate 200 is provided an electromagnetic shield case 220 made of iron, being configured as shown in FIG. 4 attached herewith, for example. However, at the upper part of each side wall of this shield case 220 formed a projecting portion to be inserted into a slit, which formed on the substrate 100, thereby fixing the said shield case 220 thereon. In addition thereto, not shown in the figure, but on the surface of one of the substrate 100 and the sub-tuner holding substrate 200, such as, the lower surface side, for example, there is provided a grounding layer at the portion facing to the sub-tuner 120. In this manner, with providing of the holding mechanism 123 on the upper side of the tuner unit, it is possible to connect the tuner (or the sub-tuner) unit 120 on the lower side, thereby fixing it onto the substrate 100 above.

And, as is apparent in FIG. 3(B), the height "D" of the holding mechanism 123 is determined to be larger than the height "d" of a terminal of the main tuner 110, projecting from the lower surface of the substrate (D>d), for the purpose of preventing the terminal from contacting on the upper surface of the sub-tuner 120 under the condition of mounting or packaging the main tuner 110 and the sub-tuner 120 on both surfaces of the substrate 100.

Figure 5:
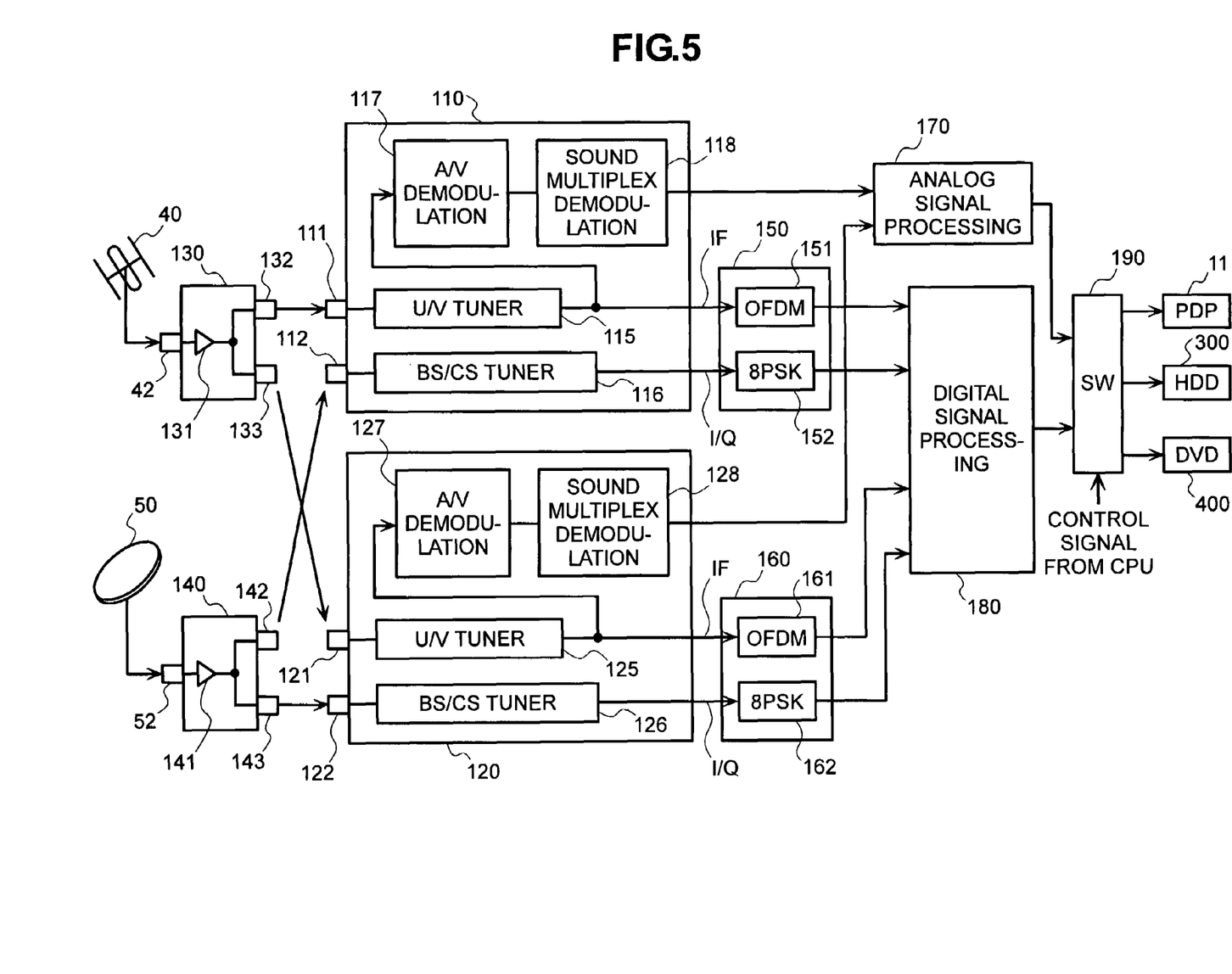
FIG. 5 is a block diagram for showing the entire circuit of the circuit structure of the broadcast receiving apparatus, mainly around the tuner portion thereof.

Following to the above, explanation will be made on the circuit structures of the broadcast receiving apparatus, the detailed structures of which was explained in the above, in particular, mainly the tuner portions thereof, including the main tuner 110 and the sub-tuner 120 thereof, by referring to FIG. 5. As is apparent from this figure, each the distributors (i.e., the antenna splitters) 130 or 140 comprises an amplifier within an inside thereof, and thereby amplifying a very weak signal received by means of the antenna 40 or 50 up to a predetermined level. And the signal is separated, and supplied, i.e., through the input terminal 111 or 112 to the main tuner 110, or through the input terminal 112 or 122 to the sub-tuner 120, respectively.

On the other hand, as was mentioned previously, each of the main tuner 110 and the sub-tuner 120 is constructed to be as the three-in-one tuner capable to receive the three (3) kinds of broadcast signals, and for example, in the main tuner 110, the input signal from the input terminal 111 is outputted in the form of an IF signal after being inputted into a U/V tuner circuit 115 for the terrestrial broadcast signal. On the other hand, the input signal from the input terminal 112 is outputted in the form of an I/Q signal after being inputted into a tuner circuit for BS/CS signals. However, those IF and I/Q signals are digital signals. Further, in this three-in-one tuner, a part of the output from the U/V tuner circuit 115 is outputted to an analog signal processing circuit 170 for conducing image processing or the like in the form of the analog signal, through an A/V demodulation circuit 117 for demodulating the terrestrial broadcast signal and a sound multiplex demodulation circuit 118.

On the other hand, the digital IF signal from the U/V tuner circuit 115 and the digital I/Q signal from the BS/CS tuner circuit 116 are further inputted into an OFDM circuit 151 and an 8 PSK (8 Phase Shift Keying) circuit 152 building up a digital modulation circuit 150, respectively, and after being modulated into predetermined digital signals, they are outputted to a digital signal processing circuit 180 for conducting digital signal processing, including such as MPEG decoder or the like, for example.

Further, in the similar manner to the main tuner 110, the sub-tuner 120 also comprises the U/V tuner circuit for the terrestrial broadcast signal 125, the BS/CS tuner circuit 126, the A/V demodulation circuit 127, and the sound multiplex demodulation circuit 128, thereby outputting an analog signal to the analog signal processing circuit 170, and at the same time, outputting the IF signal and the I/Q signal in the form of analog signal to digital signal processing circuit 180, through the digital demodulation circuit 160 which is also built up with the OFDM circuit 161 and the 8 PSK circuit 162.

And, the video/audio signals from the analog signal processing circuit 170 or the digital signal processing circuit 180 are outputted, through a switch (SW) circuit 190, input/output circuits of which are exchanged through a control signal from a controller apparatus for controlling the apparatus as a whole (i.e., being construed with a CPU), for example, the PDP 11 and the speakers 12 thereof (see FIG. 1(A) mentioned above) building up the display panel 11, the hard disk drive (HDD) 300 built within the apparatus for recoding the broadcast signal, or the digital versatile player/recorder (so-called, the DVD player/recorder) 400 attached outside the apparatus, through the external output terminal, etc., appropriately.

In this manner, with the broadcast receiving apparatus according to the present invention, the details of which were mentioned above, i.e., using the three-in-one tuner capable to receive plural kinds (three (3) kinds) of broadcast signals therein, and installing them within the thin or flat-type broadcast receiving apparatus, there is no necessity of using the antenna cable therein, which was used therein conventionally, since those tuners are disposed on both sides of the substrate, so that the antenna splitters, each being disposed vertically, can be attached directly onto the antenna input terminals of those tuners, in the structures thereof, it is advantageous from a viewpoint of performances/costs thereof, and also since the sub-tuner can be mounted on the reverse side of the substrate where conventionally no part is mounted on, therefore it is advantageous from a viewpoint of an area for mounting or packaging; i.e., enabling to mount or package the tuner portions with small-sizing and thin-sizing thereof. In particular, disposing the antenna input terminals to be perpendicular to the surface of the substrate, on which the tuner units are mounted, enables to distribute an improvement on the area for mounting or packaging thereof within the thin or flat-type television, as well as, enabling to dispose the antenna input terminals direction to the rear of the receiving apparatus; therefore it makes the operation for connecting the antenna cable easy. Thus, with small-sizing of also the structures of the distributors, to which the antennal input terminals are connected, it is possible to provide the tuner units that hardly generates attenuation of the very weak signal level due to winding-around of the cables, the distributors for the same, and also the broadcast receiving apparatus using those therein.

Also, since the tuner units having the same configuration can be used as the main tuner and the sub-tuner (i.e., enabling the common use), it is possible to deal with a single tuner model, depending on a situation on the market or the like, easily, by removing the lower-side tuner unit (i.e., the sub-tuner), for example.

While we have shown and described several embodiments in accordance with our invention, it should be understood that discloses embodiments are susceptible of changes and modification without departing from the scope of the invention. Therefor, we do not intend to be bound by the details shown and described herein but intend to cover all such changes and modifications that falls within the ambit of the appended claims.

What is claimed is:

1. A tuner device, being capable to receive broadcast signals differing in broadcasting method thereof, comprising:
    plural numbers of tuner units, each being able to receive the broadcast signals differing in kind of broadcasting, and having plural numbers of input terminals;
    a substrate to mount said plural numbers of tuner units on both surfaces thereof, disposing upper and lower surfaces of said tuner units into same direction; and
    distributors configured to distribute an antenna signal, each being attached between the input terminals of said plural numbers of tuner units, bridging over the both surfaces of said substrate.

2. The tuner device, as described in the claim 1, wherein said distributor comprises the antenna input terminals, being provided in direction perpendicular to the surface of said substrate.

3. A distributor for the tuner device, as described in the claim 2, comprising:
an antenna input terminal;
a built-in amplifier for amplifying an input signal inputted therein from said antenna input terminal to a predetermined level; and
a pair of output terminals for outputting an output from said amplifier, separately.

4. The distributor, as described in the claim 3, wherein said antenna input terminal is disposed in direction perpendicular to said pair of output terminals.

5. The tuner device, as described in the claim 1, wherein said substrate comprises a grounding layer in a part thereof, being formed so as to cover one of said tuner units.

6. The tuner device, as described in the claim 5, wherein an electromagnetic shield is further provided on said one of the tuner units.

7. A distributor for the tuner device, as described in the claim 6, comprising:
an antenna input terminal;
a built-in amplifier for amplifying an input signal inputted therein from said antenna input terminal to a predetermined level; and
a pair of output terminals for outputting an output from said amplifier, separately.

8. The distributor, as described in the claim 7, wherein said antenna input terminal is disposed in direction perpendicular to said pair of output terminals.

9. A distributor for the tuner device, as described in the claim 5, comprising:
an antenna input terminal;
a built-in amplifier for amplifying an input signal inputted therein from said antenna input terminal to a predetermined level; and
a pair of output terminals for outputting an output from said amplifier, separately.

10. The distributor, as described in the claim 9, wherein said antenna input terminal is disposed in direction perpendicular to said pair of output terminals.

11. A distributor for the tuner device, as described in the claim 1, comprising:
an antenna input terminal;
a built-in amplifier for amplifying an input signal inputted therein from said antenna input terminal to a predetermined level; and
a pair of output terminals for outputting an output from said amplifier, separately.

12. The distributor, as described in the claim 11, wherein said antenna input terminal is disposed in direction perpendicular to said pair of output terminals.

13. A broadcast receiving apparatus, being capable to receive broadcast signals differing in broadcasting method thereof, as well as, plural numbers of the broadcast signals, simultaneously, comprising:
a housing;
a receiver portion, which is configured to receive the broadcast signals from different antennas;
a signal processing portion, which is configured to produce audio/video signals upon basis of the signal received by said receiving portion; and
a display portion, which is configured to display the audio/video signals from said signal processing portion, wherein
said receiver portion comprises plural numbers of tuner units, each being capable to receive the broadcast signals differing in broadcasting method thereof and having plural numbers of input terminals, said plural numbers of tuner units are mounted on both surfaces of a substrate, disposing upper and lower surfaces of said tuner units into same direction, and distributors, which are configured to distribute an antenna signal, are attached between the input terminals of said plural numbers of the tuner units, each bridging over the both surfaces of said substrate.

14. The broadcast receiving apparatus, as described in the claim 13, wherein said broadcast signals differing in broadcasting method thereof include an analog terrestrial broadcasting signal, digital BS/CS broadcasting signals, and a digital terrestrial broadcasting signal.

15. The broadcast receiving apparatus, as described in the claim 13, wherein said broadcast receiving apparatus is a television receiver comprising a recording portion for recording therein a television signal received, and the television signal received by one of said plural numbers of the tuner units is recorded into said recording portion while the television signal received by other of said plural numbers of the tuner units is displayed on said display portion.

16. The broadcast receiving apparatus, as described in the claim 13, wherein said broadcast receiving apparatus is a television receiver having two (2) screens function, and the television signal received by one of said plural numbers of the tuner units is displayed on one of said screens while the television signal received by other of said plural numbers of the tuner units is displayed on the other screen.

17. The broadcast receiving apparatus, as described in the claim 13, wherein said display portion is constructed with a flat-type display.

18. A tuner device having plural numbers of tuner units, being capable to receive broadcast signals differing in broadcasting method thereof, comprising:
a first tuner unit, being capable of receiving plural broadcast signals different in broadcasting method, including a first input terminal having input thereto one of said plural of broadcast signals, a second input terminal having input thereto a broadcast signal different from the signal being inputted into the first input terminal;
a second tuner unit, being capable of receiving plural broadcast signals differing in broadcasting method, including a first input terminal having input thereto said one of said plural of broadcast signals, a second input terminal having input thereto said broadcast signal differing from the signal being inputted into the first input terminal; and
a substrate which mounts said first tuner unit on one-side thereof, and said second tuner unit on an other side thereof, wherein said first and second tuner units are mounted on said substrate, so that each of said first input terminals of said first and second tuner units is provided in a direction parallel to a surface of said substrate, and each of said second input terminals of said first and second tuner units is provided in a direction parallel to the surface of said substrate; and
distributors configured to distribute broadcast signals which are received by an antenna, each being attached between the input terminals of said first and second tuner units, bridging over both surfaces of said substrate.

19. The tuner device, as described in claim 18, wherein said distributors comprise antenna input terminals, being provided in direction perpendicular to the surface of said substrate.

20. The tuner device, as described in claim 18, wherein said substrate comprises a grounding layer in a part thereof, being formed so as to cover one of said tuner units.

21. The tuner device, as described in claim 20, wherein an electromagnetic shield is further provided on said one of said first and second tuner units.

22. The tuner device, as described in claim 18, wherein said distributors comprise built-in amplifier for amplifying a broadcast signal inputted into an antenna input terminal to a predetermined level, and a pair of output terminals for outputting an output from said amplifier, separately.

23. The tuner device, as described in claim 18, wherein said broadcast signals differing in broadcasting method thereof include an analog terrestrial broadcasting signal, digital BS/CS broadcasting signals, and a digital terrestrial broadcasting signal, and the digital BS/CS broadcasting signals are inputted into said first input terminal of said first and second tuner units, and the terrestrial broadcasting signal is inputted into said second input terminal of said first and second tuner units.

24. A broadcast receiving apparatus, being capable to receive broadcast signals differing in broadcasting method thereof, as well as, plural numbers of the broadcast signals, simultaneously, comprising:
   a housing;
   a receiver portion, formed by a tuner device according to claim 18, which is configured to receive the broadcast signals from different antennas;
   a signal processing portion, which is configured to produce audio/video signals upon basis of the signal received by said receiving portion; and
   a display portion, which is configured to display the audio/video signals from said signal processing portion.

25. The broadcast receiving apparatus, as described in claim 24, wherein said broadcast receiving apparatus is a television receiver comprising a recording portion for recording therein a television signal received, and the television signal received by one of said first and second tuner units is recorded into said recording portion while the television signal received by other of said plural numbers of the tuner units is displayed on said display portion.

26. The broadcast receiving apparatus, as described in claim 24, wherein said broadcast receiving apparatus is a television receiver having two screens function, and the television signal received by one of said first and second tuner units is displayed on one of said screens while the television signal received by other of said plural numbers of the tuner units is displayed on the other screen.

27. The broadcast receiving apparatus, as described in claim 24, wherein said display portion is constructed with a flat-type display.

\* \* \* \* \*